United States Patent [19]

Groves

[11] 3,889,147

[45] June 10, 1975

[54] LIGHT EMITTING DIODE MODULE

[75] Inventor: Henry Tobin Groves, Van Nuys, Calif.

[73] Assignee: Litton Systems, Inc., Beverly Hills, Calif.

[22] Filed: Sept. 30, 1974

[21] Appl. No.: 510,495

[52] U.S. Cl. ................ 313/500; 313/324; 313/512; 315/51

[51] Int. Cl. ................ H05b

[58] Field of Search ........... 313/500, 512, 499, 324; 315/51, 52, 53

[56] References Cited

UNITED STATES PATENTS 3,641,390 2/1972 Nakamura ..................... 313/500 X 3,800,177 3/1974 Russ ............................. 313/324 X

*Primary Examiner*—Palmer C. Demeo

[57] ABSTRACT

A light emitting diode (LED) module having an LED array and self-contained electronic circuitry for the LED array, which circuitry includes, for example, row driving and column switching circuitry, and further having the LED array and electronic circuitry cooperating in a functional manner but physically separated so that a selected one of either the LED array or the electronic circuitry is individually accessible without corresponding access to the other.

8 Claims, 5 Drawing Figures

LIGHT EMITTING DIODE MODULE

BACKGROUND OF THE INVENTION

Light emitting diodes (LEDs) have been described and developed for use in electronic circuits; see U.S. Pat. No. 3,740,570, granted June 19, 1973, and assigned to the same assignee as the present invention. The prior art also teaches the use of LEDs in one or more arrays that are modularized with the desired associated electronic circuitry. However, such prior art LED modules have the disadvantage of requiring that a transparent cover be sealed, usually hermetically, over the entire LED array and companion electronic circuitry. The sealing of such transparent covers is performed by either using an adhesive material, such as an epoxy resin, or by metallizing the edges of the package and the transparent cover and joining the two with a solder or braze alloy. The disadvantage of the adhesive seal is that it does not meet the requirement of adequately protecting the driving and switching circuitry from the environment, particularly where moisture is involved. The disadvantage of the solder or braze alloy seal is that transparent covers such as glass are difficult to metallize and do not allow adequate heat transfer during the sealing operation to make consistently hermetic seals.

Another disadvantage such prior art LED modules have is that the thickness of the end wall of the module or package requires that the character arrays be widely spaced in order to maintain the same character array spacing between two adjacent modules as it is between adjacent arrays within the module. If the spacing is not constant from module to module, it gives a broken appearance to a line of, for instance, 40 characters made up of five eight-character modules. If wide spacing is used to maintain constant spacing from module to module, the lines of characters become difficult to read.

OBJECTS OF THE INVENTION

Accordingly, it is an object of the invention to provide a new and improved light emitting diode (LED) module.

It is an object of the invention to provide an LED module that physically separates an LED array from its associated electronic circuitry.

It is an object of the invention to provide an LED module that seals the electronic circuitry separate from the covered but visible LED array.

It is an object of the invention to provide an LED module having improved hermetic sealing of both the LED array and the associated electronic circuitry.

It is an object of the invention to provide an LED module that provides equidistant spacing between adjacent LED arrays on an LED module and between LED arrays on adjacent LED modules.

It is an object of the invention to provide an LED module that is both easier to produce and to maintain or repair.

SUMMARY OF THE INVENTION

Briefly, in accordance with the invention, a light emitting diode (LED) module is provided having a compartmented module base, first and second electrical conductors formed within the base, power conductor pins electrically connected to the first conductor, an LED array positioned on the base and electrically connected to the second conductor, the LED array positioned on the base so that adjacent LED arrays on the module and any adjacent LED arrays on adjacent LED modules are substantially equidistant between array centers, electronic circuitry positioned in a selected base compartment and electrically connected to the first and second electrical conductors, a cover for the electronic circuitry base compartment, and transparent means covering the LED array.

While the specification concludes with claims particularly pointing out and distinctly claiming the subject matter which may be regarded as the invention, the organization and method of operation, together with further objects, features, and the attending advantages thereof, may best be understood when the following description is read in connection with the accompanying drawing.

DESCRIPTION OF THE INVENTION

Figure 1:
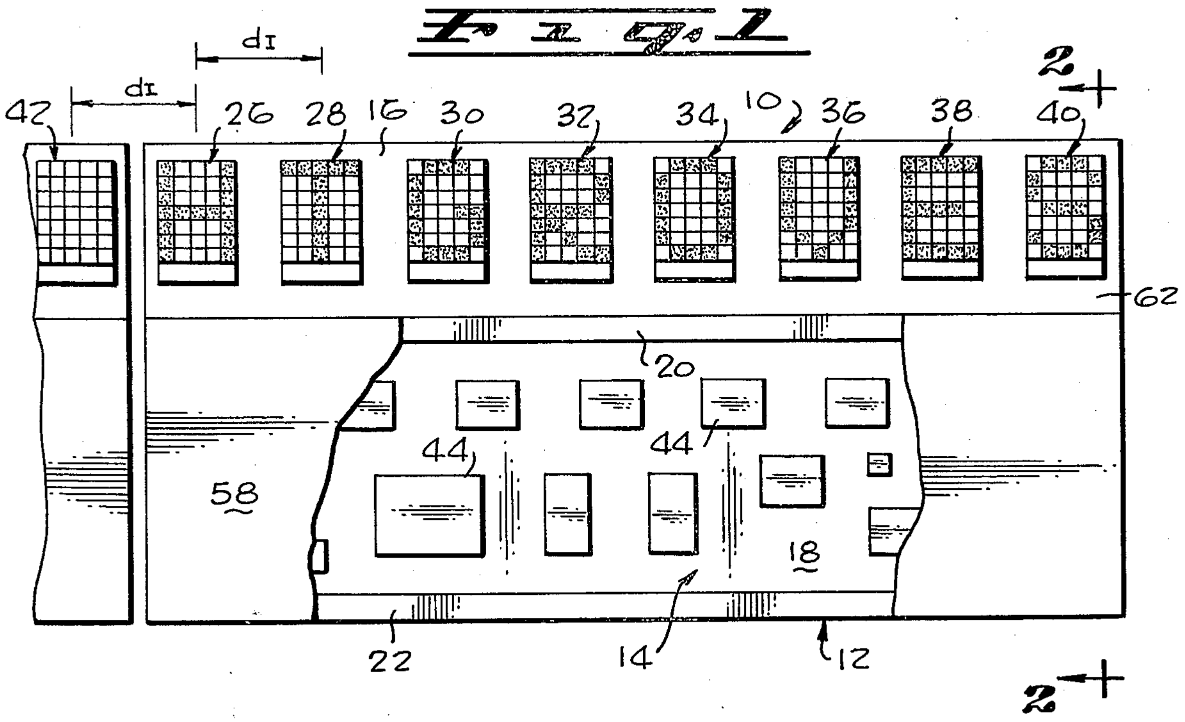
FIG. 1 is a plan view, partly sectional and partly broken away, of one light emitting diode (LED) module formed in accordance with the invention.
Figure 2:
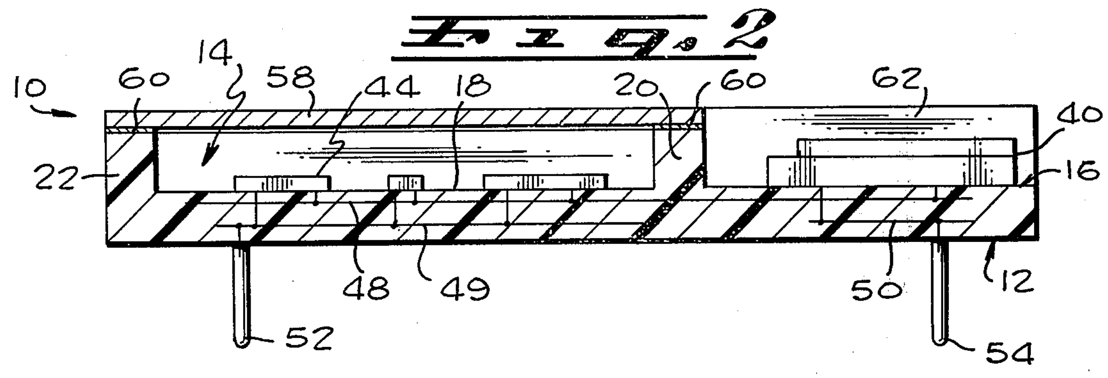
FIG. 2 is a sectional view of the LED module of FIG. 1 along the line 2—2.

Referring to FIGS. 1 and 2, one light emitting diode (LED) module 10 of the invention has a module base 12 with a base compartment or cavity 14 and an adjacent compartment or ledge region 16 that is separated from a floor region 18 of the cavity by an intermediate section 20 of a peripheral base wall 20 that surrounds and defines the cavity.

A plurality of LED character arrays 26, 28, 30, 32, 34, 36, 38, and 40 are individually formed by separate LEDs and arranged in a 5 × 7 row-and-column character array, and positioned on the ledge region 16, preferably with equidistant spacing between adjacent LED character arrays, such as the distance $d_1$ between adjacent arrays 26 and 28. The character arrays adjacent the opposite ends of an LED module, such as arrays 26 and 40 of LED module 10, cooperate with similar arrays on adjacent LED modules, such as LED module 42, to maintain the equidistant spacing $d_1$ between adjacent character arrays of adjacent LED modules.

Associated electronic circuitry 44, schematically shown and collectively identified singularly by the number 44, is positioned in the cavity 14 on the floor region 18. The electronic circuitry 44 includes row driving, column switching and any other desired associated electronic circuitry. Electrical traces or conductors 48, 49 and 50 are positioned, actually buried, in a spaced-apart relationship in the module base 12 and are representative of similar conductors buried in the LED module but not shown. The buried conductors or traces can be formed, for example, by multi-layer ceramic technology which is well developed. The LED character arrays 26, 28, 30, 32, 34, 36, 38 and 40 are electrically connected between electrical conductor 48 and electrical conductor 50, while the associated electronic circuitry is electrically connected between electrical conductor 48 and electrical conductor 49. A pair of electrical power conductor pins 52 and 54, or a plurality of similar conductor pins where required by the required electronic circuitry, are electrically connected, respectively, to electrical conductors 49 and 50.

In the form of LED module 10 illustrated by FIGS. 1 and 2, a cover 58 is secured to the base wall 22 so that the cavity 14 is sealed for environmental protection of the electronic circuitry 44. Since the electrical interconnections between the electronic circuitry 44 and the electrical conductor 48 are, like the electrical conductor itself, buried in the module base 12, the integrity of the environmental protection is maintained. The cover 58, which can be either metal or ceramic, of the LED module 10 is sealed to a metallized rim 60 of the base wall 22 by soldering or brazing; preferably, to develop a hermetically sealed cavity 14.

The LED arrays 26, 28, 30, 32, 34, 36, 38 and 40 of the LED module 10 are covered with a transparent material 62; for example, a curable epoxy. This gives the maximum environmental protection to the LED arrays. It is contemplated that the LED arrays can also be positioned in a compartment or cavity similar to cavity 14 and the resulting LED array cavity sealed with a transparent cover in a manner similar to the cover 58 for base cavity 14 that is sealed to the base wall LED module 10.

Figure 3:
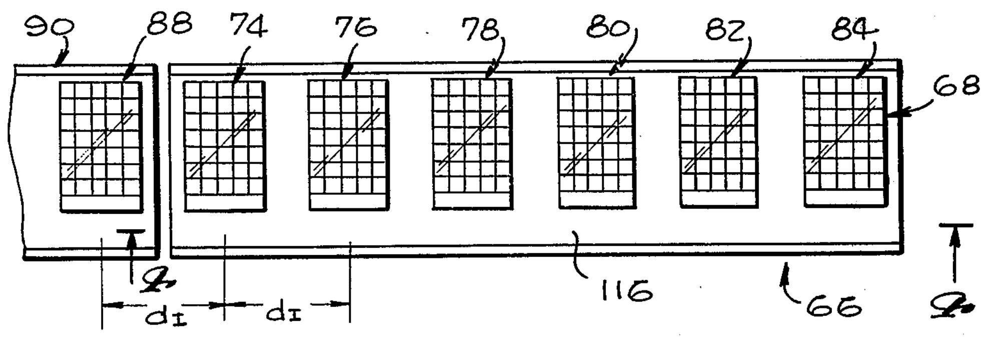
FIG. 3 is a plan view, partly broken away, of another LED module formed in accordance with the invention.
Figure 4:
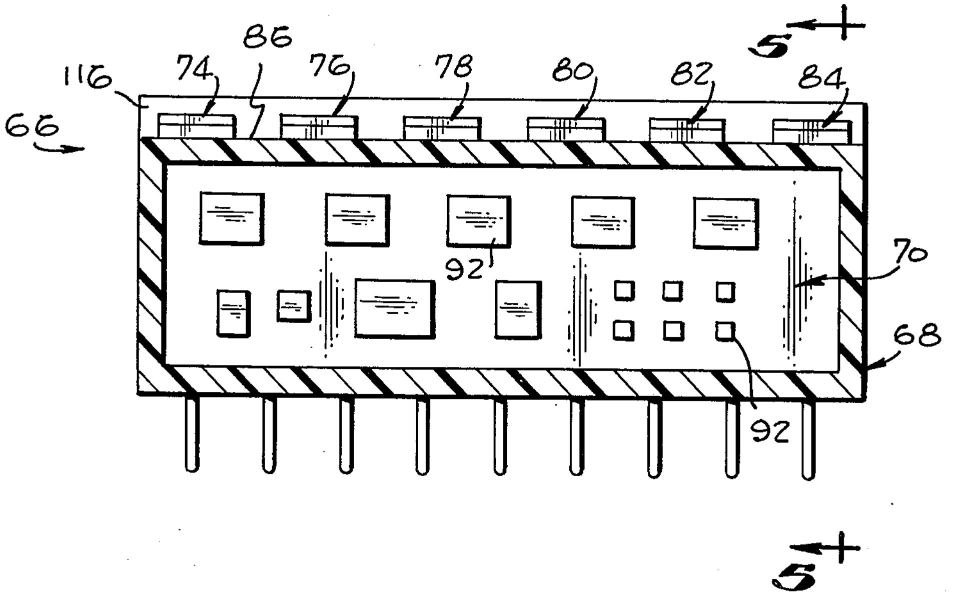
FIG. 4 is a sectional view, partly broken away, of the LED module of FIG. 3 along the line 4—4.
Figure 5:
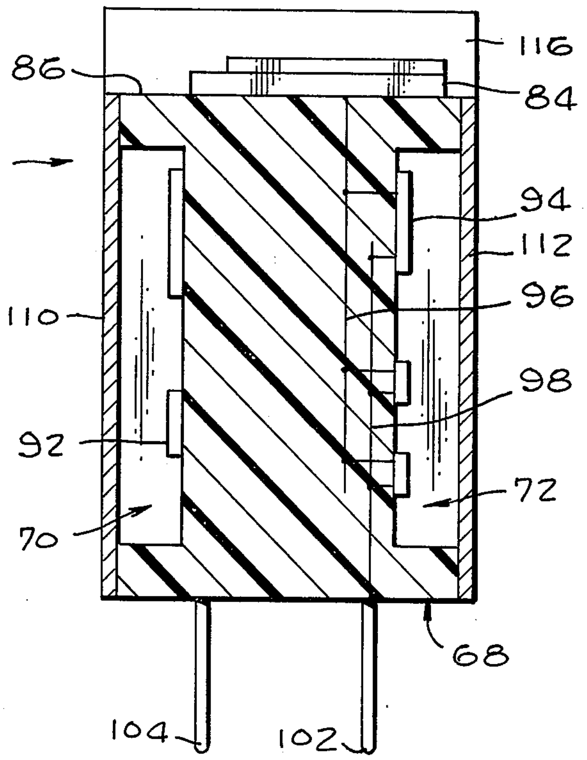
FIG. 5 is a sectional end view of the LED module of FIG. 4 along the line 5—5.

Referring to FIGS. 3, 4 and 5, another light emitting diode (LED) module 66 of the invention, which is similar to LED module 10, has a module base 68 with a pair of base compartments or cavities 70 and 72. It is contemplated that the LED module of the invention can have a plurality of compartments or cavities as may be required. A plurality of LED character arrays 74, 76, 78, 80, 82, and 84 are positioned on an end surface 86 of the module base 68, preferably with equidistant spacing between adjacent LED character arrays, such as the distance $d_1$ between adjacent arrays 74 and 76. As with the LED modules 10 and 42 of FIGS. 1 and 2, the LED character array 74 and a similar LED character array 88 of an adjacent LED module 90 as shown by FIG. 3 are also positioned to maintain the equidistant spacing $d_1$ between the adjacent character arrays 74 and 88 of the adjacent LED modules 66 and 90.

Associated electronic circuitry 92 and 94, schematically shown and collectively identified, is positioned in the respective cavities 70 and 72. Electrical traces or conductors 96 and 98 are buried in the module base 68, and as in FIGS. 1 and 2, are representative of similar conductors buried in the LED module base but not shown. The LED arrays 74, 76, 78, 80, 82, and 84 are electrically connected through conductor 96, or through similar electrical conductors (not shown), to the associated electronic circuitry 92 and 94. Electrical conductor 98, or similar conductors (not shown), is connected between the electronic circuitry 92 and electrical power conductor pin 102 of a pair of conductor pins 102 and 104.

The compartments or cavities 70 and 72 in the LED module 66 of FIGS. 3, 4 and 5 have respective covers 110 and 112 to seal the cavities for the environmental protection of the electronic circuitry contained therein in a manner similar to that described for LED module 10 as illustrated by FIGS. 1 and 2. Similarly, the LED arrays 74, 76, 78, 80, 82, and 84 of the LED module 66 are covered with a transparent cover, such as the encapsulant material 116 as illustrated by FIGS. 3, 4 and 5.

Although the LED module 10 of FIGS. 1 and 2 is functionally and structurally similar to the LED module 66 of FIGS. 3, 4, and 5, the modules are physically different which permits their utilization in different modes where physical constraints require different physical orientations of the LED module and its LED character arrays.

As will be evidenced from the foregoing description, certain aspects of the invention are not limited to the particular details of construction as illustrated, and it is contemplated that other modifications and applications will occur to those skilled in the art. It is, therefore, intended that the appended claims shall cover such modifications and applications that do not depart from the true spirit and scope of the invention.

I claim:

1. A light emitting diode module having self-contained electronic circuitry, the module comprising:

a. module base having at least a first base compartment, b. a plurality of electrical conductors formed within said base, c. at least first and second electrical power conductor pins extending outwardly from said base and electrically connected to first and second ones of said electrical conductors respectively, d. light emitting diode array positioned on said base and electrically connected between said second electrical conductor and a third one of said electrical conductors, said array positioned on said base so that adjacent arrays and arrays on adjacent modules are equidistant between array centers, e. electronic circuitry positioned in said first base compartment and electrically connected between said first and third electrical conductors to drive and switch said array in a selected manner, f. a cover for said first base compartment, and g. a transparent protective means covering said array.

2. The light emitting diode module of claim 1 in which said base has at least first and second compartments with said light emitting diode array positioned in said second compartment.

3. The light emitting diode module of claim 2 in which said first compartment is a first cavity and said second compartment is a ledge separated from said first cavity by a cavity wall.

4. The light emitting diode module of claim 1 in which said protective means is a transparent encapsulant material.

5. The light emitting diode module of claim 1 in which said base has at least first and second base compartments with said electronic circuitry positioned in said first base compartment and said light emitting diode array positioned in said second base compartment.

6. The light emitting diode module of claim 5 in which said transparent means is a transparent cover for said second base compartment.

7. The light emitting diode module of claim 6 in which said transparent cover is hermetically sealed to said second cavity.

8. The light emitting diode module of claim 1 in which said first base compartment is a first cavity having a metallized rim and said cover has a metallized surface, said metallized rim and surface being joined in a hermetically sealed relationship.

* * * * *